(12) United States Patent
Tamekawa et al.

(10) Patent No.: US 8,564,189 B2
(45) Date of Patent: Oct. 22, 2013

(54) ORGANIC EL ELEMENT AND ORGANIC EL DEVICE

(75) Inventors: Mitsugu Tamekawa, Yokkaichi (JP); Tetsuo Ishida, Kanazawa (JP)

(73) Assignee: Japan Display Central Inc., Saitama (JP)

( * ) Notice: Subject to any disclaimer, the term of this patent is extended or adjusted under 35 U.S.C. 154(b) by 341 days.

(21) Appl. No.: 13/031,885

(22) Filed: Feb. 22, 2011

(65) Prior Publication Data

US 2011/0291551 A1 Dec. 1, 2011

(30) Foreign Application Priority Data

May 26, 2010 (JP) ................................. 2010-120699

(51) Int. Cl.
*H05B 33/00* (2006.01)
*H01J 1/62* (2006.01)

(52) U.S. Cl.
USPC .............................. 313/504; 313/512; 313/46

(58) Field of Classification Search
USPC .................................... 313/504, 506, 512, 46
See application file for complete search history.

(56) References Cited

U.S. PATENT DOCUMENTS 7,990,059 B2 * 8/2011 Matsudate et al. ............ 313/512

FOREIGN PATENT DOCUMENTS

| JP | 2002-151253 A | 5/2002 |
| JP | 2006-128023 A | 5/2006 |
| JP | 2010-60970 | 3/2010 |

OTHER PUBLICATIONS

Office Action issued Apr. 13, 2012, in Japanese Patent Application No. 2010-120699 submitting English translation only.

* cited by examiner

*Primary Examiner* — Joseph L Williams
(74) *Attorney, Agent, or Firm* — Oblon, Spivak, McClelland, Maier & Neustadt, L.L.P.

(57) ABSTRACT

According to one embodiment, an organic EL element has a first electrode on a first substrate, a first carrier transport layer on the first electrode, an emitting layer on the first carrier transport layer, a second carrier transport layer on the emitting layer, a second electrode on the second carrier transport layer, a first heat absorbing layer on the second electrode, the first heat absorbing layer being separated from a center of the second electrode, and a second substrate on the first heat absorbing layer.

20 Claims, 7 Drawing Sheets

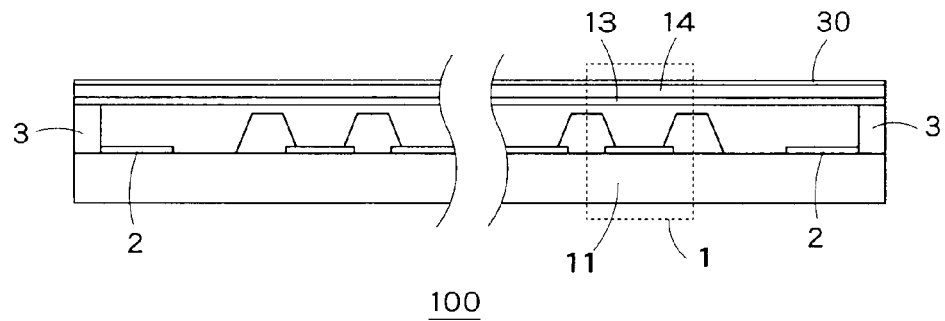
F I G. 1
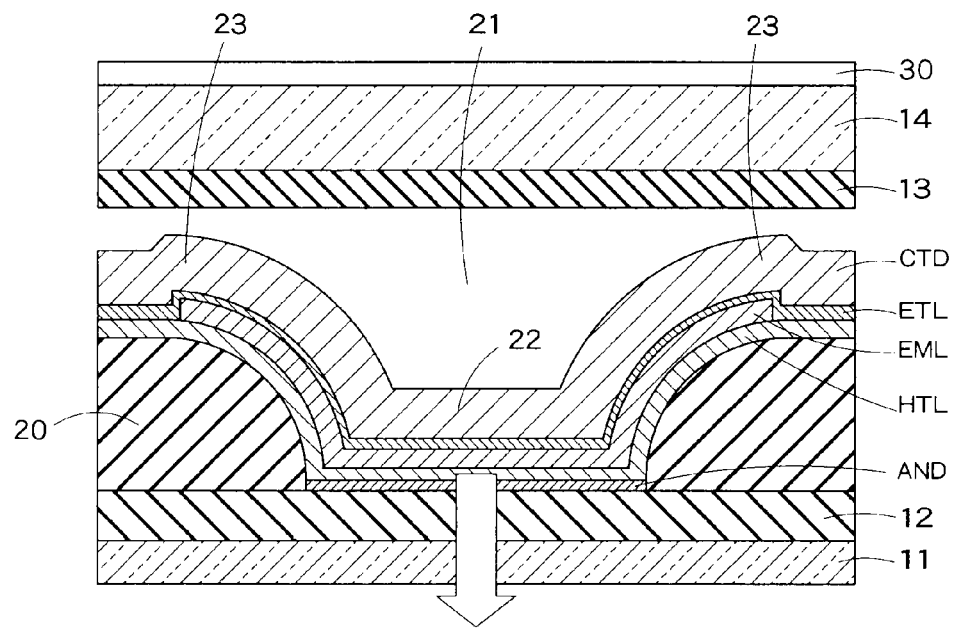
F I G. 2

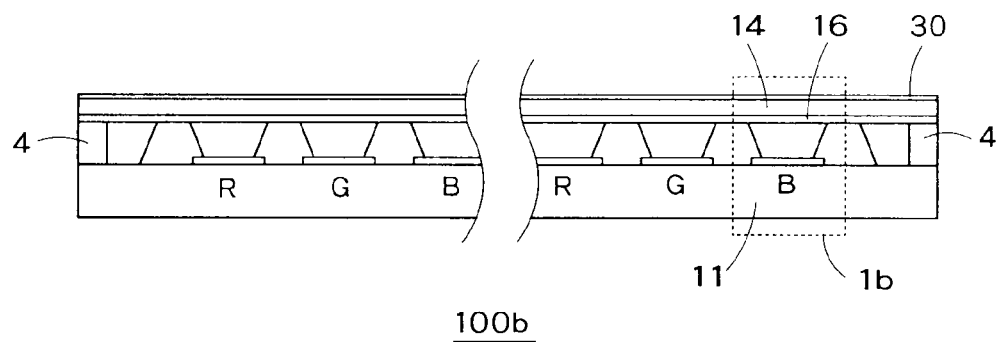
F I G. 5
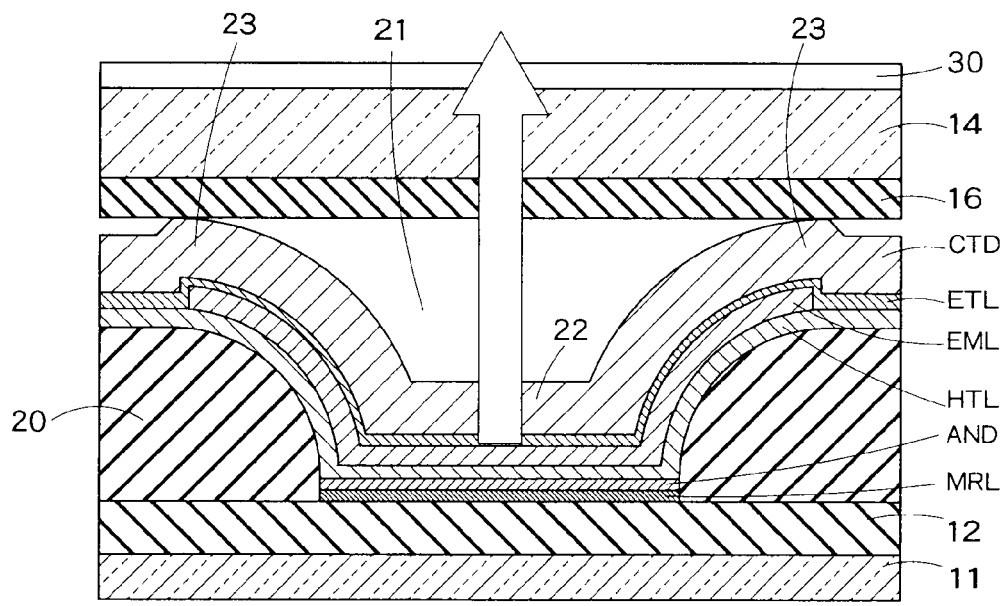
F I G. 6

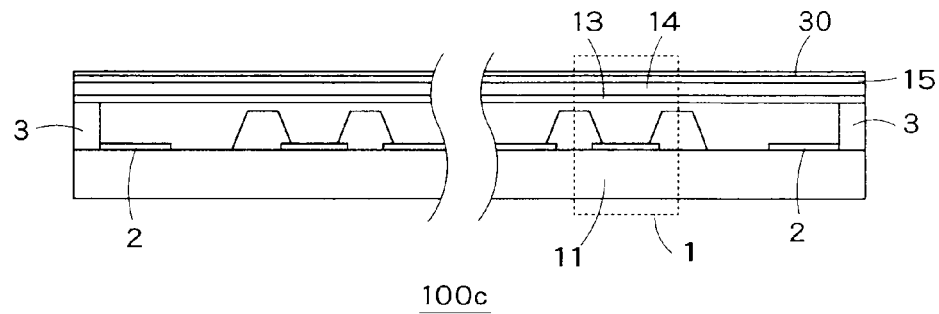
F I G. 7
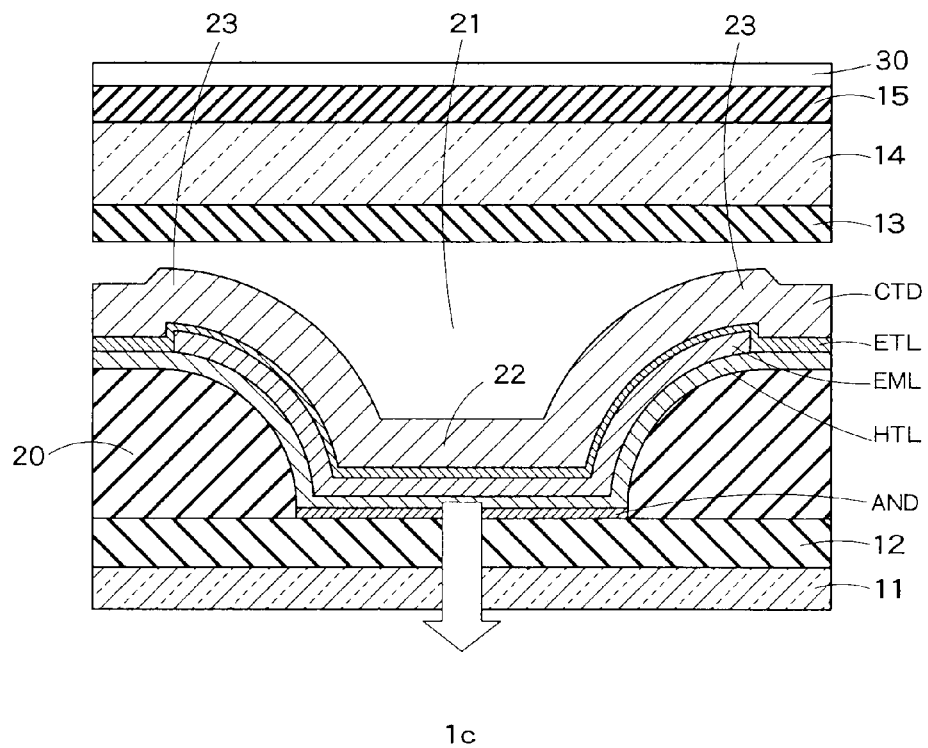
F I G. 8

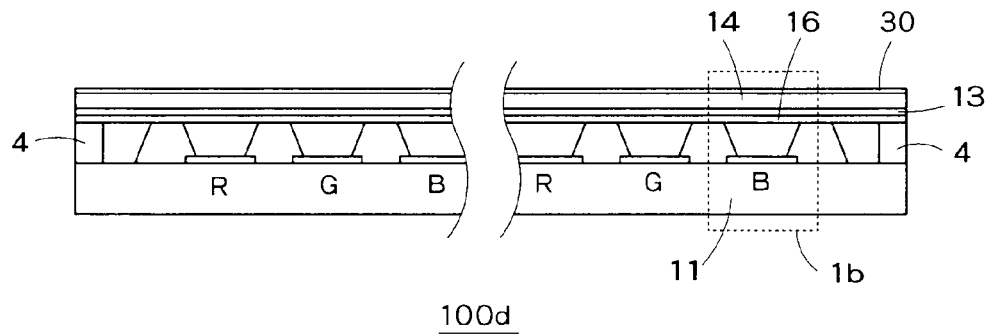
F I G. 9
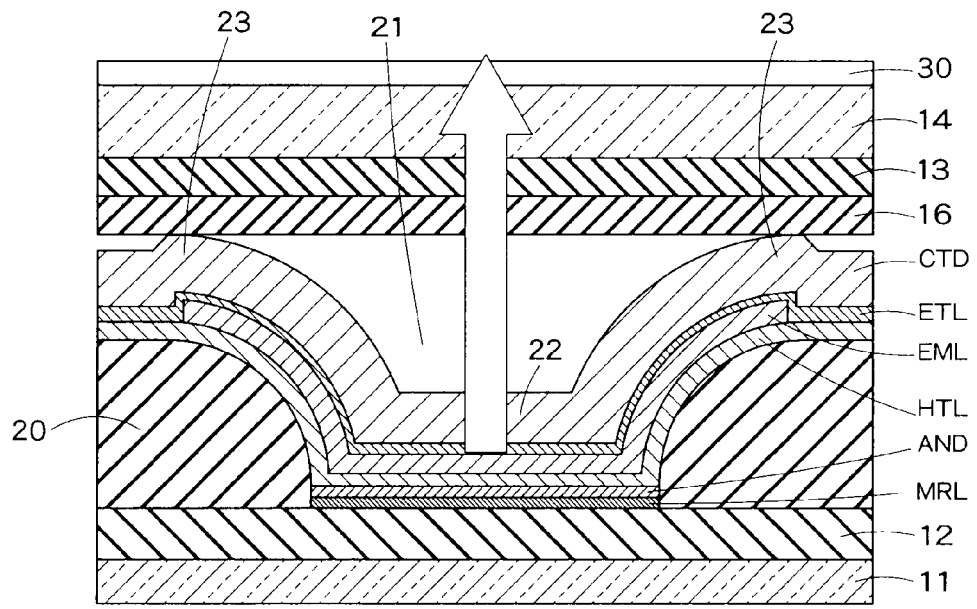
F I G. 10

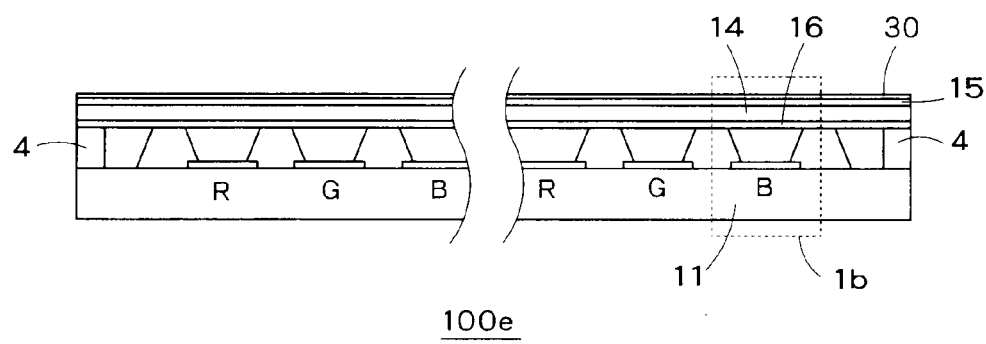
F I G. 11
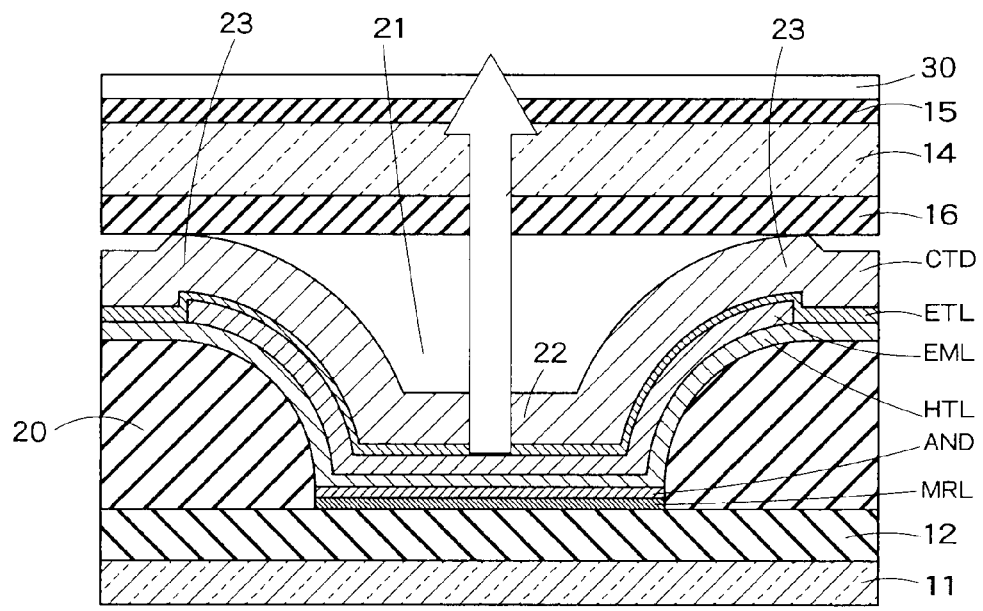
F I G. 12

ORGANIC EL ELEMENT AND ORGANIC EL DEVICE

CROSS REFERENCE TO RELATED APPLICATIONS

This application is based upon and claims the benefit of priority from the prior Japanese Patent Application No. 2010-120699, filed on May 26, 2010, the entire contents of which are incorporated herein by reference.

FIELD

Embodiments described herein relate generally to an organic EL element and an organic EL device.

BACKGROUND

An organic EL (electroluminescence) display device has an organic EL element, which is a self-luminous element, and has features, such as a wide view angle, reduced thickness of the display due to an unnecessity of a backlight, a fast response, and so on. Therefore, the organic EL display attracts attention as a display for future generation. Furthermore, in recent years, it is discussed to use the organic EL element not only for the display, but also for a light source device.

There has been a problem that the lifetime of the organic EL element becomes short due to heat at emitting. Especially, when the organic EL element is used for the light source device, it is necessary to apply a larger current to high-brightness-drive the organic EL element than that used for the display. Therefore, the amount of the generated heat becomes larger, and thus, the lifetime of the organic EL element becomes further shorter.

BRIEF DESCRIPTION OF THE DRAWINGS

FIG. 1 is a cross-section of an organic EL device 100 having an organic EL element 1 according to a first embodiment.

FIG. 2 is an enlarged cross-section of the organic EL element 1 enclosed by dotted lines of FIG. 1.

FIG. 5 is a cross-section of an organic EL device 100b having an organic EL element 1b according to the third embodiment.

FIG. 6 is an enlarged cross-section of the organic EL element 1b enclosed by dotted lines of FIG. 5.

FIG. 7 is a cross-section of an organic EL device 100c having an organic EL element 1c obtained by combining the organic EL element of FIG. 2 and that of FIG. 4.

FIG. 8 is an enlarged cross-section of the organic EL element 1c is enclosed by dotted lines of FIG. 7.

FIG. 9 is a cross-section of an organic EL device 100d having an organic EL element 1d obtained by combining the organic EL element of FIG. 2 and that of FIG. 6.

FIG. 10 is an enlarged cross-section of the organic EL element 1d enclosed by dotted lines of FIG. 9.

FIG. 11 is a cross-section of an organic EL device 100e having an organic EL element 1e obtained by combining the organic EL element of FIG. 4 and that of FIG. 6.

FIG. 12 is an enlarged cross-section of the organic EL element 1e enclosed by dotted lines of FIG. 11.

DETAILED DESCRIPTION

Figure 3:
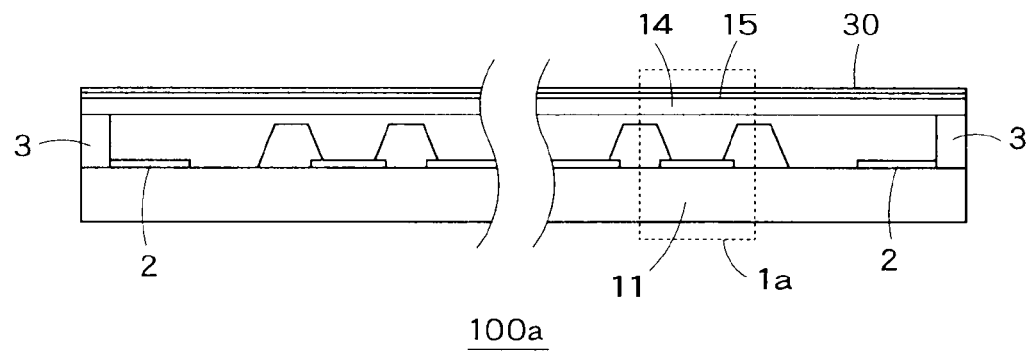
FIG. 3 is a cross-section of an organic EL device 100a having an organic EL element 1a according to the second embodiment.

In general, according to one embodiment, an organic EL element has a first electrode on a first substrate, a first carrier transport layer on the first electrode, an emitting layer on the first carrier transport layer, a second carrier transport layer on the emitting layer, a second electrode on the second carrier transport layer, a first heat absorbing layer on the second electrode, the first heat absorbing layer being separated from a center of the second electrode, and a second substrate on the first heat absorbing layer.

Embodiments will now be explained with reference to the accompanying drawings.

First Embodiment

FIG. 1 is a cross-section of an organic EL device 100 having an organic EL element 1 according to a first embodiment. FIG. 2 is an enlarged cross-section of the organic EL element 1 enclosed by dotted lines of FIG. 1. The organic EL device 100 is obtained by arranging the "300" organic EL elements 1 of FIG. 2 in line and is used as a light source device.

The organic EL device 100 of FIG. 1 has a plurality of organic EL elements 1, drying agents 2 and resin sealants 3 provided around the organic EL elements 1, and a heat releasing module 30. FIG. 1 shows an example of the organic EL device 100 where light emitted by the organic EL element 1 is taken out from the bottom of a substrate 11, that is, the organic EL device 100 is a bottom emission type.

The organic EL element 1 of FIG. 2 has the substrate 11, an insulating resin layer 12, an anode (first electrode) AND, a hole transport layer hole transport layer HTL, an emitting layer EML, an electron transport layer electron transport layer ETL, a cathode CTD, a carbon film (carbon layer) 13, a facing substrate 14, and a division wall 20.

The anode AND, the hole transport layer HTL, the emitting layer EML, the electron transport layer ETL and the cathode CTD are stacked on the insulating organic layer 12 formed on the substrate 11. The cathode CTD can be shared by a plurality of organic EL elements 1. The division wall 20 electrically separates the organic EL element 1 from the neighboring organic EL element 1 and made of a resin material, for example. Furthermore, TFTs (Thin Film Transistors) and so on are formed between the insulating organic layer 12 and the substrate 11 for supplying current to the organic EL element 1, which are omitted in FIG. 2.

Between the cathode CTD and the carbon film 13, there is a gap 21 filled with nitrogen and so on. The gaps 21 of the organic EL elements 1 are connected, and these gaps 21 are sealed by the resin sealants 3 provided at the ends of the organic EL device 100. Note that, although the carbon film 13 does not contact with the cathode CTD in FIG. 2, it is enough that the carbon film 13 is arranged separated from the center 22 of the cathode CTD, and the carbon film 13 can contact with the peripheries 23 of the cathode CTD.

The anode AND is a transmissive electrode made of ITO (Indium Tin Oxide), for example. The hole transport layer HTL transfers holes (first carrier) to the emitting layer EML. The electron transport layer ETL transfers electrons (second carrier) to the emitting layer EML. The emitting layer EML is formed of a host such as $Alq_2$ (Aluminum quinol complex) and a few percent of dopant doped in the host. When the holes and the electrons are supplied to the emitting layer EML, the dopant receives energy from the host to emit light whose color depends on a kind of the dopant.

When the emitting layer EML emits light, the emitting layer EML generates heat. Especially, when the organic EL device 100 is used as the light source device, because it is necessary to apply a large current from the driving TFT, the heat generated by the emitting layer EML becomes large.

Therefore, in the present embodiment, the carbon film 13 and the facing substrate 14 are arranged above the cathode CTD. The carbon film 13 and the facing substrate 14 are formed as below. Firstly, the carbon film 13 made of amorphous carbon having a thickness of 1 μm, for example, is formed on the facing substrate 14 by spin-coating water solubility carbon past on the facing substrate 14 made of glass, for example. Then, the facing substrate 14 is arranged above the cathode CTD and sealed by the resin sealants 3 while the carbon film 13 facing to the cathode CTD. The facing substrate 14 functions as a protection film for protecting the cathode CTD and so on. Furthermore, the heat releasing module 30 is arranged on the face of facing substrate 14 opposite side of the face on which the carbon film 13 is formed. The heat releasing module 30 is, for example, a heat releasing plate or a heat releasing tape made of copper or aluminum.

The carbon film 13 absorbs the heat generated by the emitting layer EML. The heat absorbed by the carbon film 13 is transferred to the heat releasing module 30 through the facing substrate 14 and is released to the outside of the organic EL device 100 efficiently. Because of this, the heat around the emitting layer EML is decreased, thereby suppressing the degradation of the emitting layer EML, the interface between the emitting layer EML and the hole transport layer HTL and that between the emitting layer EML and the electron transport layer ETL.

Note that, although the facing substrate 14 is drawn thickly in FIG. 2, the facing substrate 14 is formed thinly enough in order to improve the heat transmissibility from the carbon film 13 to the heat releasing module 30, in practice.

Because the heat generated by the emitting layer EML is released efficiently, the heat of the emitting layer EML can be decreased. Therefore, the lifetime of the organic EL element 1 becomes a several hundred of times as long as an organic EL element without the carbon film 13.

As stated above, in the first embodiment, the carbon film 13 is arranged above the cathode CTD as the heat releasing layer. Therefore, the heat generated by the emitting layer EML can be released to the outside efficiently, and the lifetime of the organic EL element 1 becomes long.

Note that, the organic EL device 100 of FIG. 1 and the organic EL element 1 of FIG. 2 is an example, and various modifications can be conceivable.

For example, a hole injection layer HIL can be formed between the anode AND and the hole transport layer HTL, and an electron injection layer EIL can be formed between the electron transport layer ETL and the cathode CTD. Furthermore, a hole blocking layer can be formed between the emitting layer EML and the electron transport layer ETL. By forming these layers, the emitting efficiency improves.

A stacked layer such as oxide film/nitride film/oxide film is formed on the cathode CTD to film-seal the cathode CTD. Furthermore, although an example is explained where the gap 21 is provided in the organic EL element 1, at least a part of the gap 21 can be filled with filling material such as resin. The filling material may be or may not be contact with the carbon film 13.

Instead of forming the carbon film 13 on the facing substrate 14, the carbon can be mixed in the facing substrate 14 in advance. Additionally, not the carbon film 13 but a heat absorbing layer made of other material having a high transmissibility or high endothermic material can be used. Because the heat absorbing layer is formed on or in the facing substrate 14, it is preferable that the heat absorbing layer is made of organic material compatible to the glass than metal material.

The light emitted by the organic EL element 1 can be taken out, not from the bottom of, but from the top of the organic EL device 100, that is, the organic EL device can be a top emission type. In this case, it is preferable that the carbon film 13 is formed thinly so that the light emitted by the organic EL element 1 is transmissive through the carbon film 13.

Although an example is shown where the heat releasing module 30 is formed on whole of the facing substrate 14 in FIGS. 1 and 2, the heat releasing module 30 may be formed on a part of the facing substrate 14. Additionally, the heat releasing module can be formed not on the facing substrate 14 but at a place at the outside of an area sandwiched between the substrate 11 and the facing substrate 14 and where the heat releasing module can release the heat absorbed by the heat absorbing layer.

Furthermore, the organic EL device 100 of FIG. 1 can be used, not as the light source device, but as other application such as a display device.

Second Embodiment

In the first embodiment described above, the heat absorbing layer is arranged between the facing substrate 14 and the cathode CTD. On the other hand, in a second embodiment which will be described below, the heat absorbing layer is arranged on the top face of the facing substrate 14.

Figure 4:
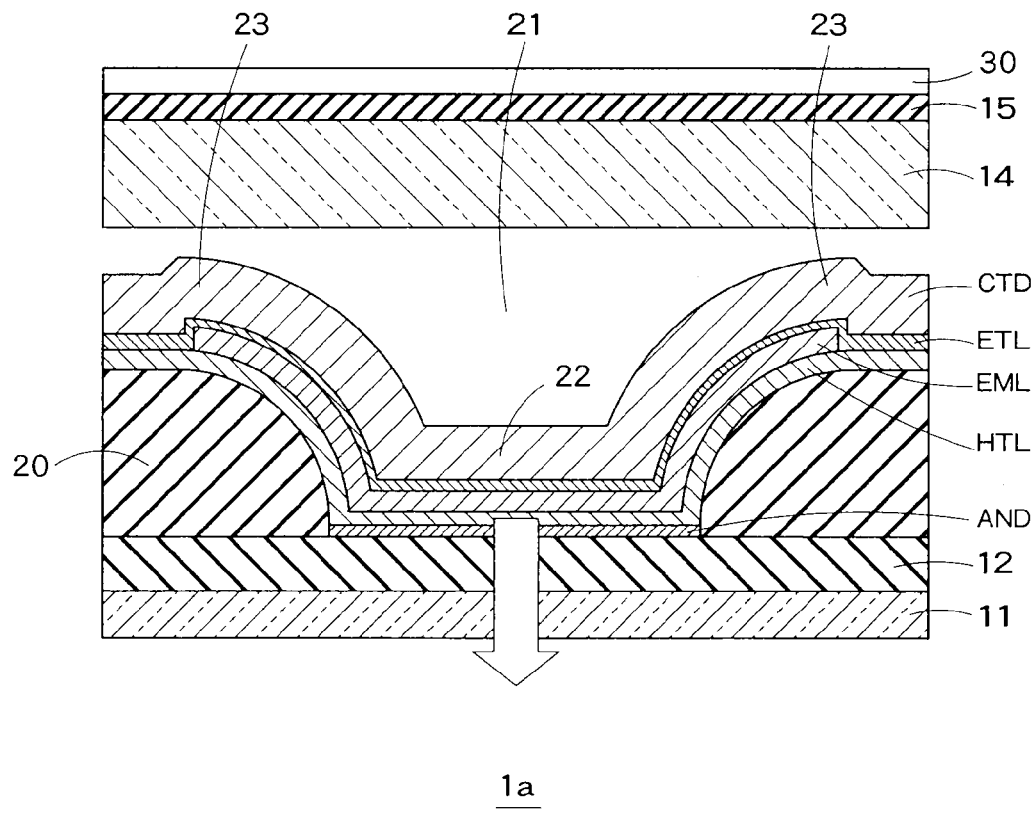
FIG. 4 is an enlarged cross-section of the organic EL element 1a enclosed by dotted lines of FIG. 3.

FIG. 3 is a cross-section of an organic EL device 100a having an organic EL element 1a according to the second embodiment. FIG. 4 is an enlarged cross-section of the organic EL element 1a enclosed by dotted lines of FIG. 3. In FIGS. 3 and 4, components common to those of FIGS. 1 and 2 have common reference numerals, respectively. Hereinafter, components different from FIGS. 1 and 2 will be mainly described below.

The organic EL element 1a of FIG. 4 has a facing substrate 14 and a carbon tape (carbon layer) 15 as a heat absorbing layer. The facing substrate 14 is formed above the cathode CTD, and the carbon tape 15 is formed on the face opposite side of the cathode CTD. Although the facing substrate 14 does not contact with the cathode CTD in FIG. 14, it is enough that the facing substrate 14 is arranged separated from the center 22 of the cathode CTD, and the facing substrate 14 can contact with the peripheries 23 of the cathode CTD.

The carbon tape 15 has a thickness of 0.2 mm, for example, and is composed of material having carbon and adhesive. The carbon tape 15 is attached on the facing substrate 14 in advance. The organic EL element 1a having a structure of FIG. 4 is obtained by arranging the facing substrate 14 above the cathode CTD. In the present embodiment, the heat absorbing layer can be formed more simply than the first embodiment where the carbon film 13 is formed by spin-coating. Note that, the heat releasing module 30 such as heat releasing plate is arranged.

The heat generated by the emitting layer EML is absorbed by the carbon tape 15 through the facing substrate 14. The heat is transferred to the heat releasing module 30 and released to the outside of the organic EL device 100a.

As stated above, in the second embodiment, the carbon tape 15 is arranged as a heat absorbing layer on the facing substrate 14. Therefore, the heat generated by the emitting layer EML can be released to the outside efficiently, and the lifetime of the organic EL element 1a becomes long.

Third Embodiment

The organic EL devices described in the first and the second embodiments are bottom emission type. On the other hand, an organic EL device of a top emission type will be described in a third embodiment.

FIG. 5 is a cross-section of an organic EL device 100b having an organic EL element 1b according to the third embodiment. FIG. 6 is an enlarged cross-section of the organic EL element 1b enclosed by dotted lines of FIG. 5. The organic EL device 100b of FIG. 5 is obtained by arranging the organic EL elements 1b of FIG. 6 in a matrix form and is used as a display device. In FIGS. 5 and 6, components common to those of FIGS. 1 and 2 have common reference numerals, respectively. Hereinafter, components different from FIGS. 1 and 2 will be mainly described below.

The organic EL device 100b of FIG. 5 has a plurality of organic EL elements 1b, flit sealants 4 and a heat releasing module 30. FIG. 5 shows an example of the organic EL device 100b where light emitted by the organic EL element 1b is taken out from the facing substrate 14, that is, the organic EL device 100b is a top emission type.

The organic EL element 1b of FIG. 6 has a reflecting layer reflecting layer MRL formed under the anode AND. The material of the reflecting layer MRL is, for example, aluminum or silver and so on. The reflecting layer MRL reflects the light emitted by the organic EL element 1b to the substrate 11 side toward the facing substrate 14 side. The cathode CTD is a transmissive electrode made of ITO, or a semi-transmissive electrode made of alloy of magnesium and silver. At least a part of the light emitted by the organic EL element 1b and reflected by the reflecting layer MRL is transmissive through the cathode CTD and is taken out to the outside of the organic EL device 100b.

The organic EL element 1b is capable of emit red (R), green (G) or blue (B) light where the color depends on the kind of the dopant doped in the host of the emitting layer EML.

In the present embodiment, an organic material layer 16 and the facing substrate 14 is arranged on the cathode CTD. The material of the organic material layer 16 can be $Alq_2$ which is a host of the emitting layer EML, or materials used in the hole transport layer HTL or the electron transport layer ETL. By using the material included in the organic EL element 1b as the material of the organic material layer 16, pollution of the organic EL element 1b or a manufacturing device thereof can be prevented. Furthermore, comparing to using another material, the cost can be decreased. Instead of the organic material layer 16, a carbon layer which is thin enough for the light to be transmissive may be used.

Similar to the above described embodiments, the organic material layer 16 functions as a heat absorbing layer.

Furthermore, the center 22 of the cathode CTD is arranged separated from the organic material layer 16 while the peripheries 23 thereof contact with the organic material layer 16. The organic material layer 16 can contact with the peripheries 23 by vacuating the surrounding area of the cathode CTD to seal while pushing down the organic material layer 16 and the facing substrate 14 on the cathode CTD. Because the organic material layer 16 is softer than metal, there is little possibility that the cathode CTD and the facing substrate 14 are damaged.

In the organic EL device 100b of the top emission type, if there is a gap between the cathode CTD and the organic material layer 16, interference patterns will occur. This is because the light strengthens and weakens each other dependent on the size of the gap. If the interference patterns occur, the image quality deteriorates when the organic EL device 100b is used as a display device.

On the other hand, in the present embodiment, the organic material layer 16 contacts with the peripheries 23 of the cathode CTD. Therefore, the interference patterns can be suppressed, thereby improving the displayed image quality. Because the organic material layer 16 is thin (for example, 200 nm), little interference patterns occur even if the thickness of the organic material layer 16 varies in some degree.

As stated above, in the third embodiment, because the organic material layer 16 is arranged on the cathode CTD, the heat generated by the emitting layer EML can be released to the outside efficiently. Furthermore, because the peripheries 23 of the cathode CTD contacts with the organic material layer 16, it is possible to suppress the interference patterns.

Fourth Embodiment

In a fourth embodiment which will be described below, the first to the third embodiments are combined.

FIG. 7 is a cross-section of an organic EL device 100c having an organic EL element 1c obtained by combining the organic EL element of FIG. 2 and that of FIG. 4. FIG. 8 is an enlarged cross-section of the organic EL element 1c enclosed by dotted lines of FIG. 7. Although FIG. 8 shows an example of the organic EL device 100c of the bottom emission type, the organic EL device 100c can be the top emission type. In FIG. 8, the carbon film 13 is formed under the bottom face of the facing substrate 14, and the carbon tape 15 is formed on the top face thereof. Although the carbon film 13 does not contact with the cathode CTD in FIG. 8, it is enough that the carbon film 13 is arranged separated from the center 22 of the cathode CTD, and the carbon film 13 may be contact with the peripheries 23 thereof. Because both of the carbon film 13 and the carbon tape 15 absorb the heat generated by the emitting layer EML, it is possible to release the heat more efficiently, and the lifetime of the organic EL element 1c becomes long.

FIG. 9 is a cross-section of an organic EL device 100d having an organic EL element 1d obtained by combining the organic EL element of FIG. 2 and that of FIG. 6. FIG. 10 is an enlarged cross-section of the organic EL element 1d enclosed by dotted lines of FIG. 9. Although FIG. 10 shows an example of the organic EL device 100d of the top emission type, the organic EL device 100d can be the bottom emission type. In FIG. 10, the carbon film 13 is formed under the bottom face of the facing substrate 14, and the organic material layer 16 is formed under the carbon film 13. The center 22 of the cathode CTD is arranged separated from the organic material layer 16, and the peripheries 23 thereof contact with the organic material layer 16. Because of this, it is possible to suppress the interference patterns. Furthermore, because both of the organic material layer 16 and the carbon film 13 absorb the heat generated by the emitting layer EML, it is possible to release the heat more efficiently, and the lifetime of the organic EL element 1d becomes long.

FIG. 11 is a cross-section of an organic EL device 100e having an organic EL element 1e obtained by combining the organic EL element of FIG. 4 and that of FIG. 6. FIG. 12 is an enlarged cross-section of the organic EL element 1e enclosed by dotted lines of FIG. 11. Although FIG. 12 shows an example of the organic EL device 100e of the top emission type, the organic EL device 100e can be the bottom emission type. In FIG. 12, the carbon tape 15 is formed on the top face of the facing substrate 14, and the organic material layer 16 is formed under the bottom face thereof. The center 22 of the cathode CTD is arranged separated from the organic material layer 16, and the peripheries 23 thereof contact with the organic material layer 16. Because of this, it is possible to suppress the interference patterns. Furthermore, because both of the organic material layer 16 and the carbon tape 15 absorb the heat generated by the emitting layer EML, it is possible to release the heat more efficiently, and the lifetime of the organic EL element 1e becomes long.

Figure 13:
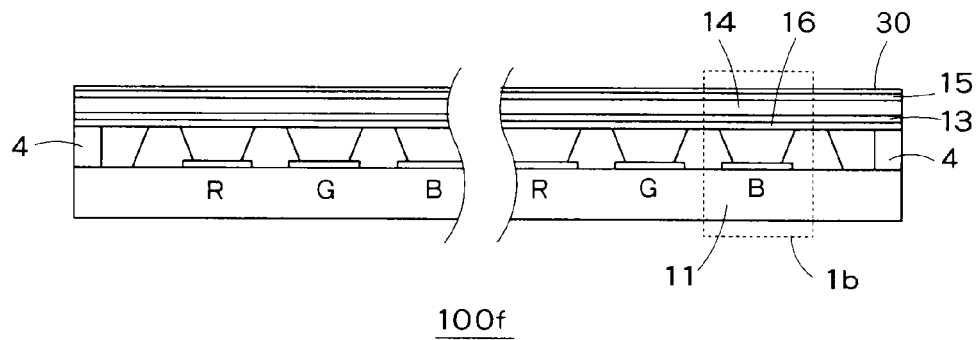
FIG. 13 is a cross-section of an organic EL device 100f having an organic EL element 1f obtained by combining the organic EL element of FIG. 2, that of FIG. 4 and that of FIG. 6.
Figure 14:
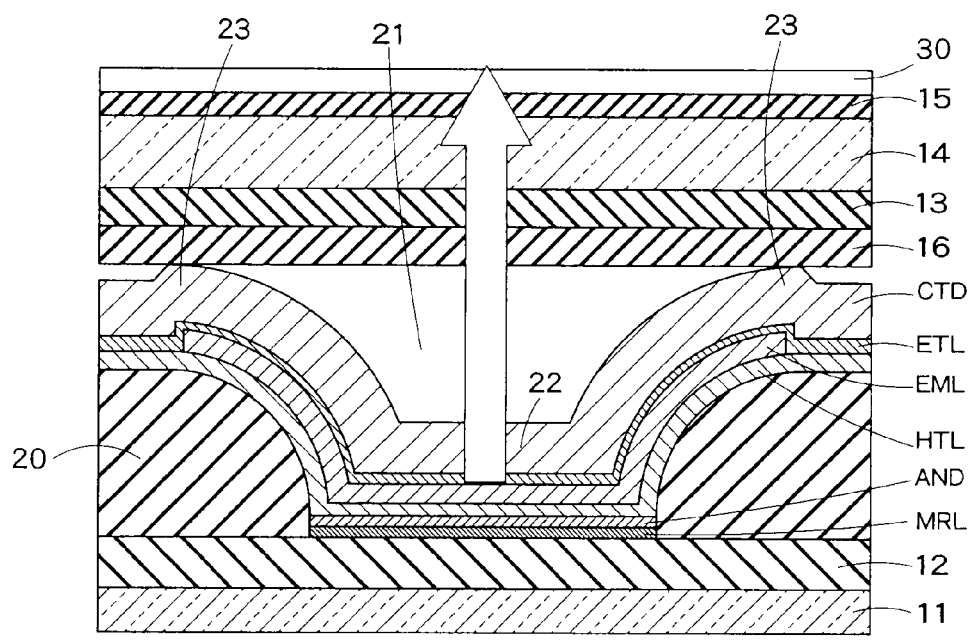
FIG. 14 is an enlarged cross-section of the organic EL element 1f enclosed by dotted lines of FIG. 13.

FIG. 13 is a cross-section of an organic EL device 100f having an organic EL element 1f obtained by combining the organic EL element of FIG. 2, that of FIG. 4 and that of FIG. 6. FIG. 14 is an enlarged cross-section of the organic EL element 1f enclosed by dotted lines of FIG. 13. Although FIG. 14 shows an example of the organic EL device 100f of the top emission type, the organic EL device 100f can be the bottom emission type. In FIG. 14, the carbon tape 15 is formed on the top face of the facing substrate 14, the carbon film 13 is formed under the bottom face of thereof, and the organic material layer 16 is formed under the carbon film 13. The center 22 of the cathode CTD is arranged separated from the organic material layer 16, and the peripheries 23 thereof contact with the organic material layer 16. Because of this, it is possible to suppress the interference patterns. Furthermore, because the carbon film 13, organic material layer 16 and the carbon tape 15 absorb the heat generated by the emitting layer EML, it is possible to release the heat more efficiently, and the lifetime of the organic EL element 1f becomes long.

As stated above, in the fourth embodiment, because the organic EL element has two or more of the carbon film 13, the carbon tape 15 and the organic material layer 16, the heat can be released more efficiently, and the lifetime of the organic EL element 1f becomes long. Furthermore, by forming the organic material layer 16 and contacting the peripheries 23 of the cathode CTD with the organic material layer 16, the heat can be released efficiently and the interference patterns can be suppressed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. An organic EL element comprising:
a first electrode on a first substrate;
a first carrier transport layer on the first electrode;
an emitting layer on the first carrier transport layer;
a second carrier transport layer on the emitting layer;
a second electrode on the second carrier transport layer;
a first heat absorbing layer on the second electrode, the first heat absorbing layer being separated from a center of the second electrode; and
a second substrate on the first heat absorbing layer.

2. The element of claim 1, wherein the first heat absorbing layer is a carbon layer.

3. The element of claim 1, wherein the first heat absorbing layer is an organic material layer.

4. The element of claim 3, wherein a material of the organic material layer is identical to at least of one a material of the first carrier transport layer, a material of the emitting layer and a material of the second carrier transport layer.

5. The element of claim 1 further comprising a heat releasing module configured to release heat absorbed by the first heat absorbing layer.

6. The element of claim 5, wherein the heat releasing module is arranged at an outside of an area sandwiched between the first and the second substrates.

7. The element of claim 1 further comprising a second heat absorbing layer on the second substrate.

8. The element of claim 1 further comprising a second heat absorbing layer between the second electrode and the first heat absorbing layer.

9. The element of claim 8 further comprising a third heat absorbing layer on the second substrate.

10. The element of claim 1, wherein light emitted by the emitting layer is take from a side of the second substrate to an outside, and
the center of the second electrode is separated from the first heat absorbing layer, and a periphery of the second electrode contacts with the first heat absorbing layer.

11. The element of claim 1, wherein light emitted by the emitting layer is taken from a side of a first substrate to an outside.

12. An organic EL element comprising:
a first electrode on a first substrate;
a first carrier transport layer on the first electrode;
an emitting layer on the first carrier transport layer;
a second carrier transport layer on the emitting layer;
a second electrode on the second carrier transport layer;
a second substrate on the second electrode, the second substrate being separated from a center of the second electrode, the second substrate comprising a first face facing the second electrode and a second face opposite from the second face; and
a first heat absorbing layer on the second face of the second substrate.

13. The element of claim 12, wherein the first heat absorbing layer is a carbon layer.

14. The element of claim 12 further comprising a heat releasing module configured to release heat absorbed by the first heat absorbing layer.

15. An organic EL device comprising:
a first substrate;
a first electrode on the first substrate;
a first carrier transport layer on the first electrode;
an emitting layer on the first carrier transport layer;
a second carrier transport layer on the emitting layer;
a second electrode on the second carrier transport layer;
a first heat absorbing layer on the second electrode, the first heat absorbing layer being separated from a center of the second electrode;
a second substrate on the first heat absorbing layer; and
a sealant configured to seal the first substrate and the first heat absorbing layer.

16. The device of claim 15 further comprising a heat releasing module configured to release heat absorbed by the first heat absorbing layer.

17. The device of claim 15 further comprising a second heat absorbing layer on the second substrate.

18. The device of claim 15 further comprising a second heat absorbing layer between the second electrode and the first heat absorbing layer.

19. An organic EL device comprising:
a first substrate;
a first electrode on the first substrate;
a first carrier transport layer on the first electrode;
an emitting layer on the first carrier transport layer;
a second carrier transport layer on the emitting layer;
a second electrode on the second carrier transport layer;
a second substrate on the second electrode, the second substrate being separated from a center of the second electrode, the second substrate comprising a first face facing the second electrode and a second face opposite from the second face; and
a first heat absorbing layer on the second face of the second substrate,
a sealant configured to seal the first substrate and the second substrate.

20. The device of claim 19 further comprising a heat releasing module configured to release heat absorbed by the first heat absorbing layer.

* * * * *